(12) United States Patent
Fuke et al.

(10) Patent No.: US 8,681,508 B2
(45) Date of Patent: Mar. 25, 2014

(54) ELECTRONIC APPARATUS (75) Inventors: Kazuya Fuke, Kawasaki (JP); Tsutomu Takahashi, Kawasaki (JP); Yoshiyuki Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 300 days.

(21) Appl. No.: 13/234,748

(22) Filed: Sep. 16, 2011

(65) Prior Publication Data
US 2012/0075815 A1 Mar. 29, 2012

(30) Foreign Application Priority Data
Sep. 28, 2010 (JP) ................................ 2010-217648

(51) Int. Cl.
*H05K 5/00* (2006.01)
(52) U.S. Cl.
USPC ............ 361/756; 361/690; 361/759; 439/160
(58) Field of Classification Search
USPC ............................ 361/756, 690, 759; 439/160
See application file for complete search history.

(56) References Cited

U.S. PATENT DOCUMENTS

| 5,030,108 A * | 7/1991 | Babow et al. ................... 439/64 |
| 5,216,578 A * | 6/1993 | Zenitani et al. ............... 361/690 |
| 2010/0124034 A1* | 5/2010 | Shouyama et al. ........... 361/756 |
| 2011/0090655 A1* | 4/2011 | Zieman ......................... 361/759 |
| 2012/0108093 A1* | 5/2012 | Sato et al. ..................... 439/160 |

FOREIGN PATENT DOCUMENTS

| JP | 05-291771 | 11/1993 |
| JP | 07-162170 | 6/1995 |

* cited by examiner

*Primary Examiner* — Xiaoliang Chen
(74) *Attorney, Agent, or Firm* — Staas & Halsey LLP (57) ABSTRACT

An electronic apparatus includes a housing having a first connector; a Plug In Unit (PIU) having a second connecter, coupled to the first connector, and inserted into the housing; a first guide mechanism (1st GM) provided on the housing and/or the PIU; a second guide mechanism (2nd GM) provided on another housing and/or the PIU and guides insertion of the PIU in cooperation with the 1st GM so that the first connector is coupled to the second connector. The 1st GM, for example, includes a guide cylinder, and the 2nd GM, for example, includes a pin inserted into the guide cylinder; a fixed cylinder surrounding the pin; and a movable member, which has a hole that passes through the fixed cylinder, and the movable member is held by the fixed cylinder to be movable in the axial direction. The guide cylinder pushes the movable member when the pin is inserted.

2 Claims, 15 Drawing Sheets

ELECTRONIC APPARATUS

CROSS-REFERENCE TO RELATED APPLICATIONS

This application is based upon and claims the benefit of priority from the prior Japanese Patent Application No. 2010-217648 filed on Sep. 28, 2010, the entire contents of which are incorporated herein by reference.

FIELD

The embodiments discussed herein are related to an electronic apparatus.

BACKGROUND

There is a known electronic apparatus having a housing, into which a Plug-In-Unit (PIU) may be inserted and from which the PIU may be detached. The technique related to this electronic apparatus is disclosed in Japanese Laid-open Patent Publication No. 5-291771.

SUMMARY

According to an aspect of the invention, an electronic apparatus includes: a housing which has a first connector; a Plug In Unit which has a second connecter, which may be coupled to the first connector, and may be inserted into the housing; a first guide mechanism which is provided on one of the housing and/or the Plug In Unit; a second guide mechanism corresponding to the first guide mechanism which is provided on the other one of the housing and/or the Plug In Unit and guides insertion of the Plug In Unit into the housing in cooperation with the first guide mechanism so that the first connector is coupled to the second connector; wherein the first guide mechanism, for example, includes a guide cylinder, wherein the second guide mechanism, for example, includes: a guide pin which may be inserted into the guide cylinder; a fixed cylinder which surrounds the guide pin; and a movable member, which has a hole that passes through the fixed cylinder in an axial direction, and the movable member is held by the fixed cylinder to be movable in a prescribed range in the axial direction, and wherein the guide cylinder pushes the movable member when the guide pin is inserted.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 7 is a perspective view of a guide mechanism 103a.

DETAILED DESCRIPTION OF THE PREFERRED EMBODIMENTS

Each of the PIU and the housing disclosed in the related art is provided with a connector to be coupled with each other. The connectors are coupled with each other when the PIU is inserted into the housing. If the inserting speed of the PIU into the housing is fast, a shock may be given to the PIU and to the housing when the connectors are coupled with each other. If the shock is large, chattering may occur or a terminal of the connecter may be deformed.

Embodiments will be described below.

First Embodiment

Figure 1A:
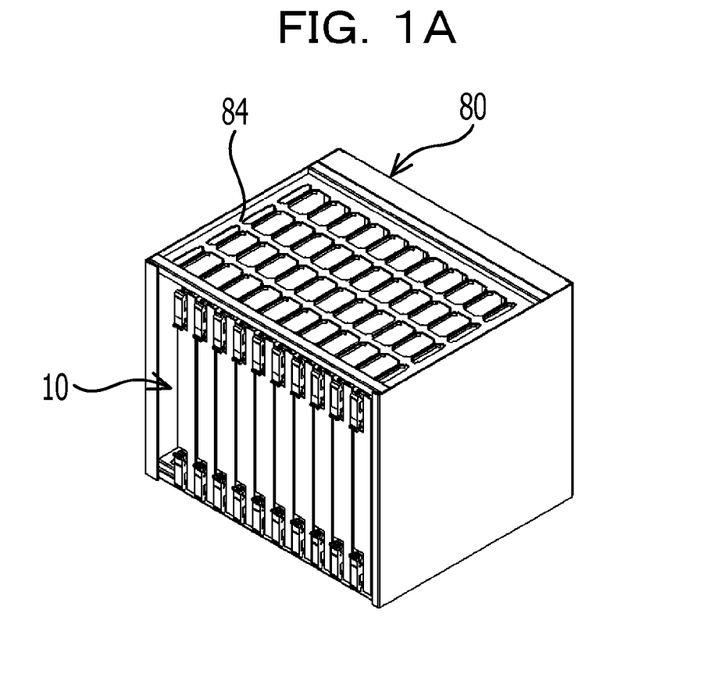
FIG. 1A is an explanatory diagram of an electronic apparatus according to a first embodiment.
Figure 1B:
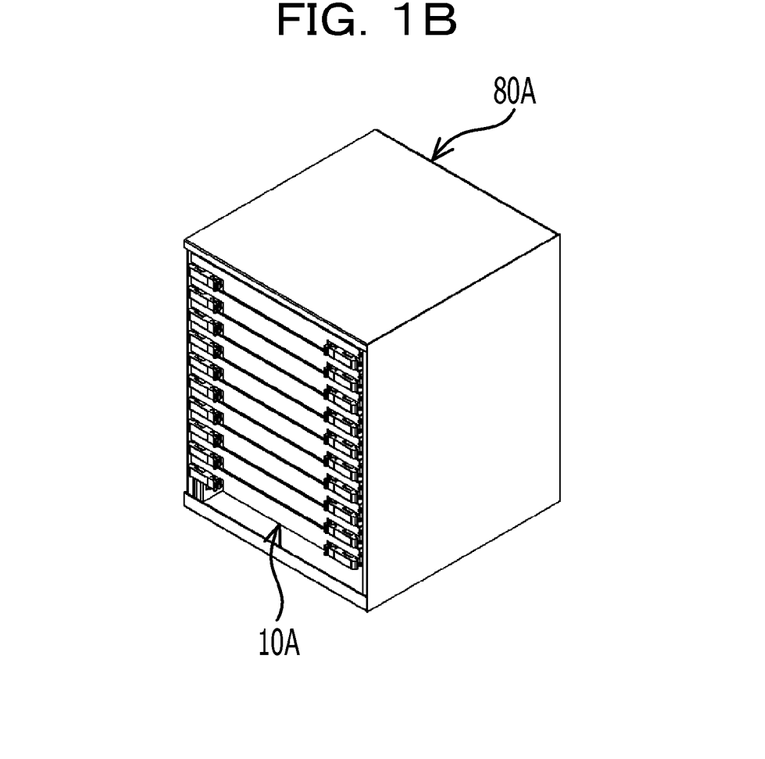
FIG. 1B is a modification example of the electronic apparatus according to the first embodiment.

FIG. 1A is an explanatory diagram of an electronic apparatus according to a first embodiment. The electronic apparatus according to the first embodiment includes a plurality of Plug In Units (hereinafter referred to as PIUs) 10 and a housing 80 that may store the plurality of PIUs 10. The housing 80 stores the plurality of PIUs 10 vertically. FIG. 1B is a deformation (alternative) example of the electronic apparatus 1 according to the first embodiment. According to the deformation example of the electronic apparatus 1, a housing 80A may store the plurality of PIUs 10 laterally. The electronic apparatus illustrated in FIG. 1A will be described below.

Figure 2:
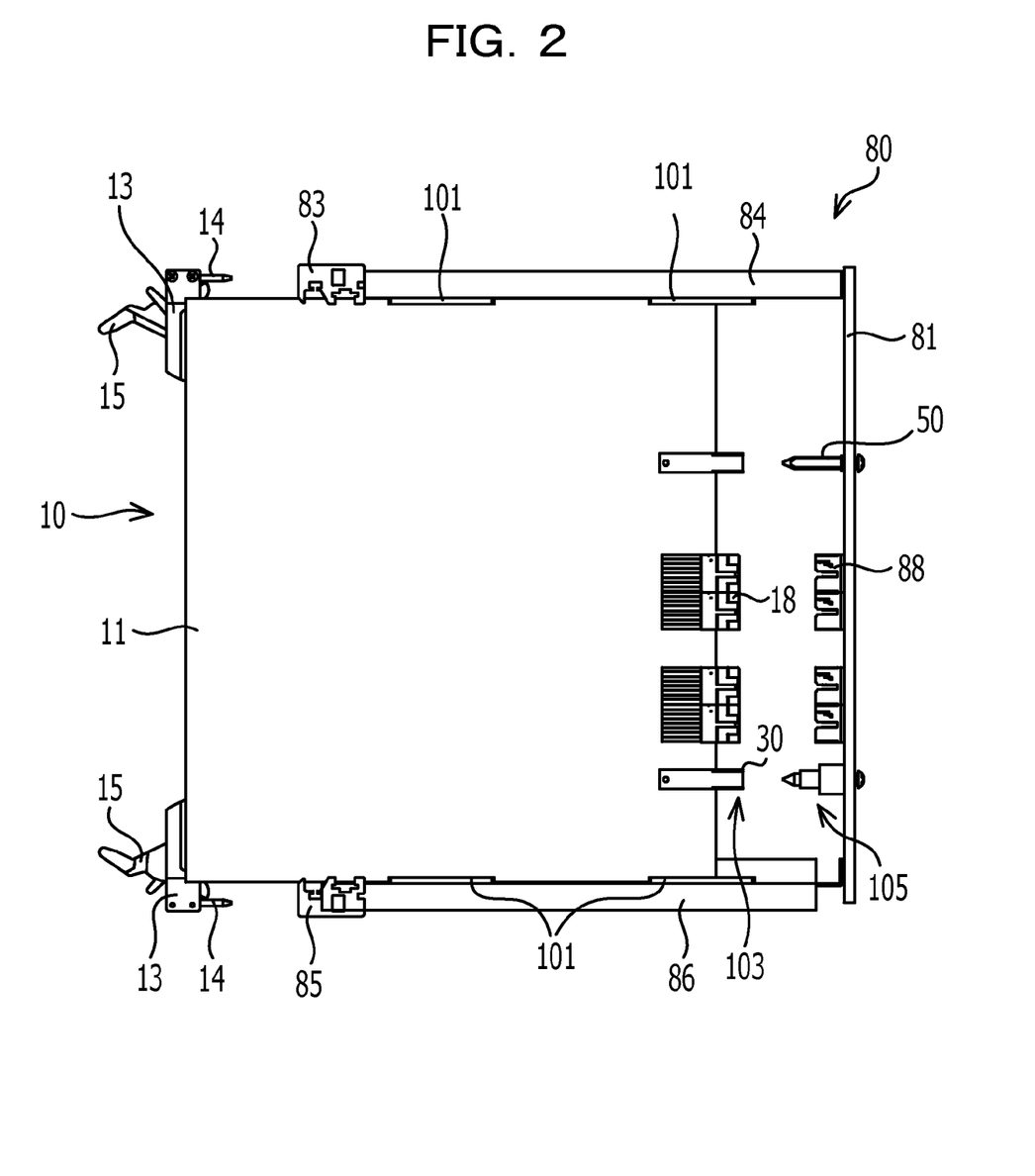
FIG. 2 is a diagram illustrating a structure of the electronic apparatus according to the first embodiment.

FIG. 2 is a diagram illustrating a structure of the electronic apparatus according to the first embodiment. FIG. 2 illustrates a state in which the PIU 10 is being inserted into the housing 80. The PIU 10 includes a hard printed substrate 11 formed in a plate shape, an attachment member 13 attached on the printed substrate 11, and a lever 15 provided on the attachment member 13. The PIU 10 includes a plurality of connectors 18 mounted on the printed substrate 11. The printed substrate 11 is mounted with electronic components (not illustrated). The housing 80 includes a backplane (or back wiring board) 81 allocated on the back surface of the housing 80, an upper wall unit 84, and a bottom wall unit 86. A frame 83 is provided on the upper edge of an insertion opening of the housing 80 into which the PIU 10 is inserted. A frame 85 is provided on the lower edge of the insertion opening. The lever 15 of the PIU 10 may lock the PIU 10 to the frame 83 while the frame 83 abuts the attachment member 13. The frame 83 has a hole into which a guide pin 14 of the PIU 10 is inserted. A guide rail 101 that guides movement of the printed substrate 11 is provided on the upper wall unit 84 and the bottom wall unit 86. The backplane 81 is mounted with a plurality of connectors 88. When the PIU 10 is inserted into the housing 80, the connector 18 is engaged with the connector 88. Accordingly, the printed substrate 11 is electrically coupled to the backplane 81.

A guide cylinder 30 is provided on the printed substrate 11. A guide pin 50 is provided on the backplane 81. When the PIU 10 is inserted into the end of the housing 80, the guide pin 50 is inserted into the guide cylinder 30. Accordingly, the insertion of the PIU 10 into the housing 80 is guided. Similarly, the guide pin 14 is inserted into the hole formed on the frame 83. A guide mechanism 103 is provided on the printed substrate 11. A guide mechanism 105 is provided on the backplane 81. The guide mechanisms 103 and 105 have a function for cooperatively guiding the insertion of the PIU 10 into the housing 80.

Figure 3:
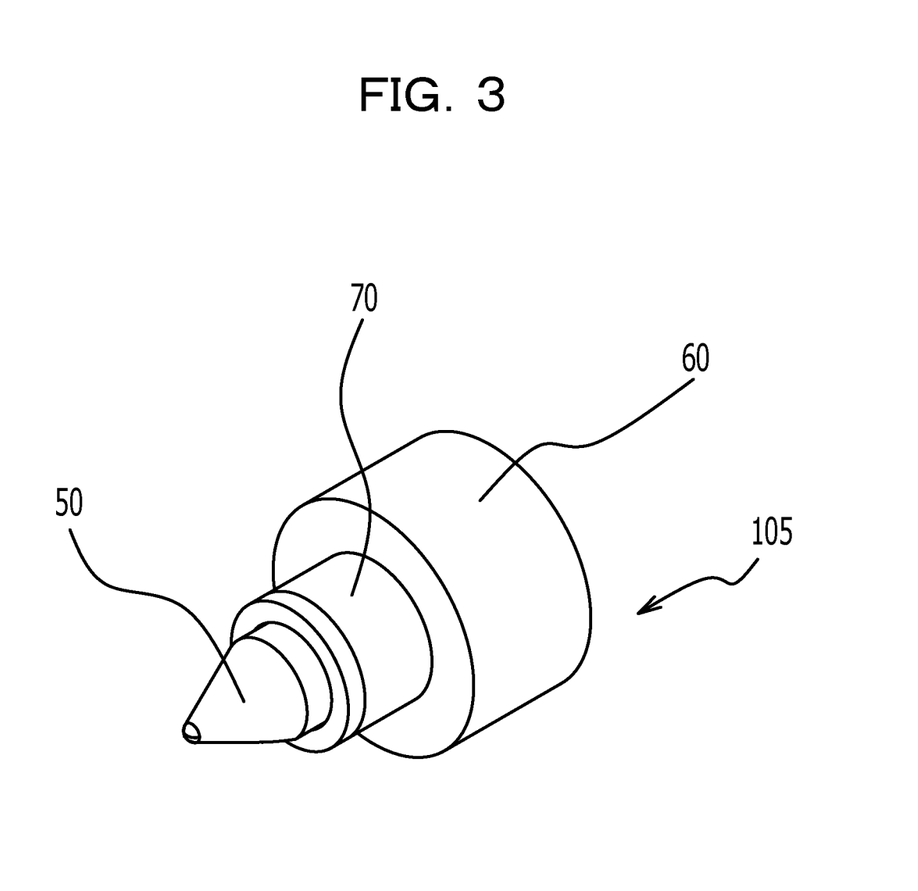
FIG. 3 is a perspective view of a guide mechanism.
Figure 4A:
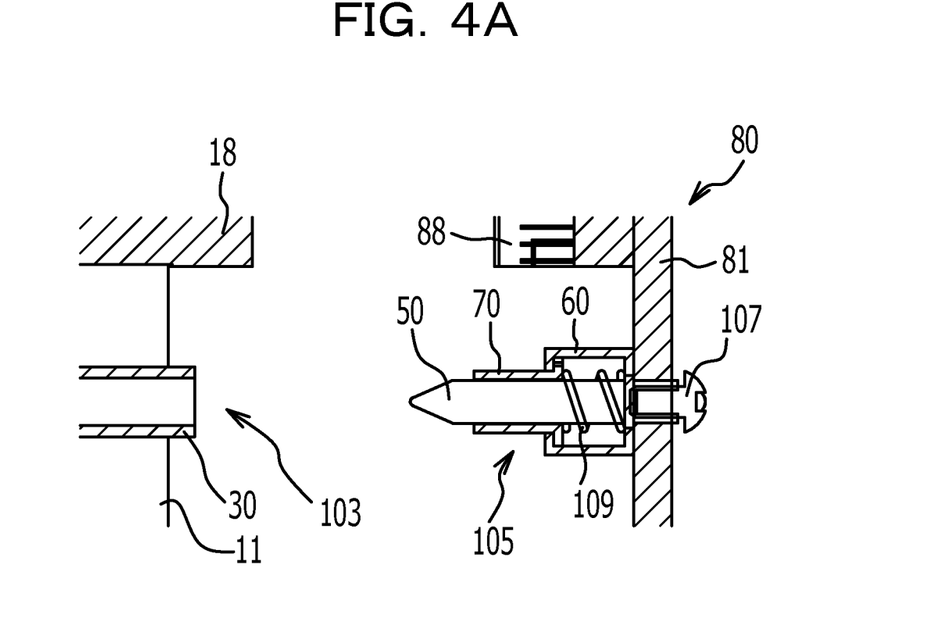
FIGS. 4A and 4B are explanatory diagrams of guide mechanisms 103 and 105.
Figure 4B:
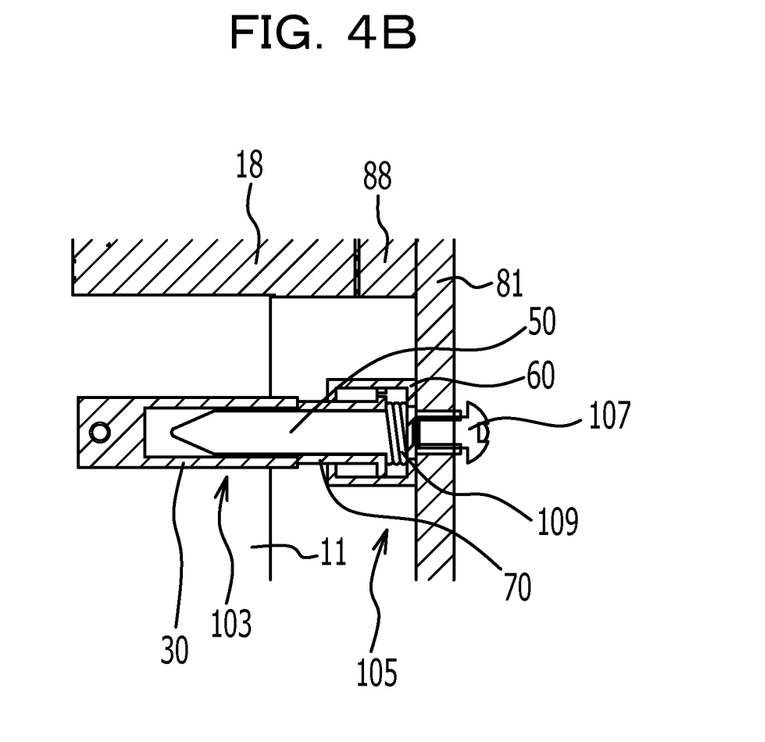
Figure 5A:
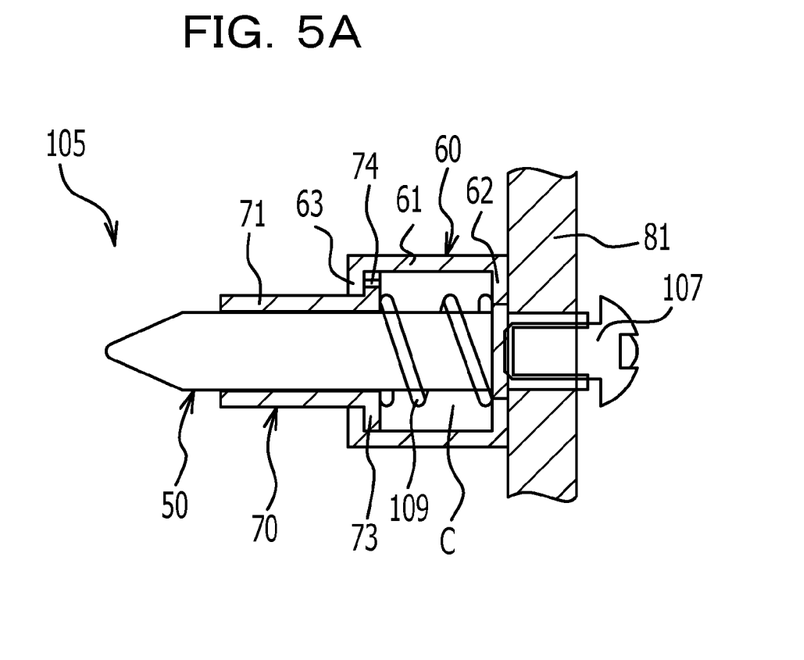
FIG. 5A is an enlarged diagram of the guide mechanism illustrated in FIG. 4A.
Figure 5B:
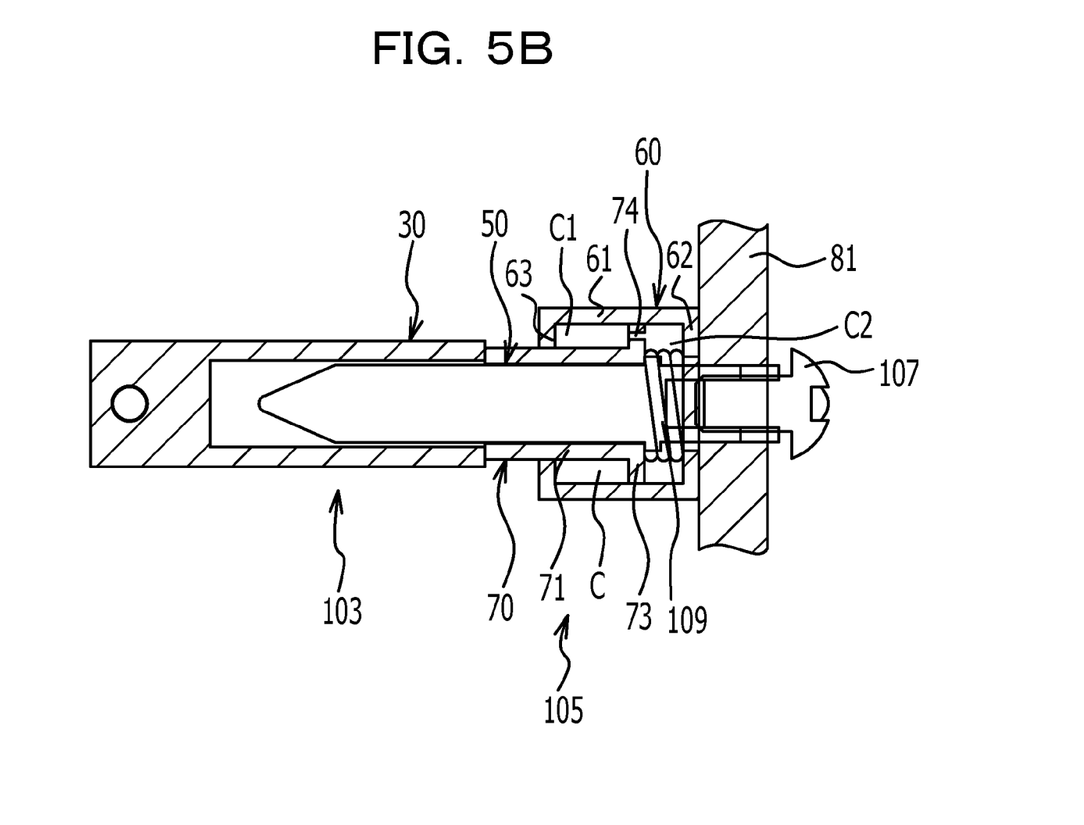
FIG. 5B is an enlarged diagram of the guide mechanism illustrated in FIG. 4B.

FIG. 3 is a perspective view of the guide mechanism 105 on the side of the backplane 81. FIGS. 4A and 4B are explanatory diagrams of the guide mechanisms 103 and 105. FIG. 5A is an enlarged diagram of the guide mechanism 105 on the side of the backplane 81 illustrated in FIG. 4A. FIG. 5B is an enlarged diagram of the guide mechanisms 103 and 105 illustrated in FIG. 4B. The guide mechanism 103 on the side of the PIU 10 includes a guide cylinder 30. The guide cylinder 30 is formed in a nearly square cylinder shape. The tip of the guide cylinder 30 is projected from the base end (an end with connector(s) 18 to be engaged with connectors 88 of the backplane) of the printed substrate 11. The guide mechanism 105 on the side of the backplane 81 includes the guide pin 50, a fixed cylinder 60, and a movable member 70. The guide pin 50 is secured to the backplane 81 with a screw 107. The guide pin 50 is extended toward the PIU 10. The tip of the guide pin 50 is formed in an approximately conical shape. The fixed cylinder 60 is secured to the backplane 81 while surrounding a part of the guide pin 50. The fixed cylinder 60 is formed in an approximately circular cylinder shape. The guide pin 50 and the tip of the movable member 70 are projected from the fixed cylinder 60. The movable member 70 is formed in an approximately circular cylinder shape and is held between the guide pin 50 and the fixed cylinder 60 to be movable in a prescribed range in the axial direction of the guide pin 50 and the fixed cylinder 60.

As illustrated in FIG. 5A, the movable member 70 includes a cylinder unit 71 and a flange unit 73 provided on the base end side of the cylinder unit 71. The fixed cylinder 60 includes a side wall unit 61 formed in a circular cylinder shape and a base end wall unit 62 secured to the backplane 81. The fixed cylinder 60 includes a tip end wall unit 63 having a hole through which the cylinder unit 71 of the movable member 70 and the guide pin 50 pass. Since the flange unit 73 of the movable member 70 abuts the tip end wall unit 63 of the fixed cylinder 60, the movement range of the movable member 70 is limited in the axial direction. According to an aspect of an embodiment, the movable member 70 has a hole or passage way that passes air within the fixed cylinder 60 during movement of the movable member 70 in the axial direction. For example, the flange unit 73 has a hole 74 that is extended in the axial direction. The guide pin 50 passes through the cylinder unit 71.

An energizing member 109 is provided inside the internal space C of the fixed cylinder 60. The energizing member 109 is a coil-shaped metallic spring. The energizing member 109 is rolled at the base of the guide pin 50. The energizing member 109 energizes the movable member 70 toward the PIU 10. The movable member 70 is pushed, by the guide cylinder 30 described below, against the energizing force of the energizing member 109. Accordingly, the energizing member 109 energizes the movable member 70 in an opposite direction of the direction in which the movable member 70 is pushed by the guide cylinder 30. The guide pin 50 is formed in an approximately circular column shape. The fixed cylinder 60 and the movable member 70 are formed in an approximately circular cylinder shape. Furthermore, the guide pin 50 may be formed in an approximately square column shape. The fixed cylinder 60 and the movable member 70 may be formed in an approximately square cylinder shape.

When the PIU 10 is inserted into the end of the housing 80, the guide pin 50 is inserted into the guide cylinder 30 first. Due to this, the inserting direction of the PIU 10 into the housing is guided. The guide cylinder 30 abuts the movable member 70 and pushes the movable member 70 against the energizing force of the energizing member 109. As illustrated in FIG. 4B, the energizing member 109 is compressed so that the connector 18 is engaged with the connector 88. Before the connector 18 is engaged with the connector 88, the guide cylinder 30 pushes the movable member 70. Accordingly, the connector 18 is engaged with the connector 88 while the inserting speed of the PIU 10 is reduced.

A reason why the inserting speed of the PIU 10 is reduced will be described below. The flange unit 73 has the hole 74. If the movable member 70 in the state illustrated in FIG. 5A is pushed by the guide cylinder 30, the internal space C is divided into a space C1 and a space C2 by the flange unit 73 as illustrated in FIG. 5B. The space C1 is a space on the side of the PIU 10. The space C2 is a space on the side of the backplane 81. If the movable member 70 is pushed by the guide cylinder 30, the air in the space C2 is compressed. Thus, the pressure in the space C2 becomes high. If the space C1 gets larger, the pressure of the space C1 becomes negative. Accordingly, a pressure difference is generated between the space C1 and the space C2. Due to this pressure difference, the movable member 70 is not easily moved to the side of the backplane 81. As a result, the inserting speed of the PIU 10 into the housing 80 is reduced. Part of the air inside the space C2 passes through to the back surface of the backplane 81 and flows into the space C1 through the hole 74.

In this manner, the PIU 10 is prevented from being inserted fast into the housing 80. This prevents occurrence of a shock in the PIU 10, the housing 80, and another PIU 10 when the PIU 10 is inserted into the housing 80. For example, if a shock is given to the housing 80 when the PIU 10 is inserted fast into the housing 80, chattering may occur between the terminal of the connector of another PIU 10 already stored in the housing 80 and the terminal of the connector of the housing 80 that is to be engaged with the terminal of the PIU 10. The terminal of the connector 88 abuts the rim of the insertion hole of the connector 18 that is engaged with the terminal, and the terminal of the connector 88 may be plastically deformed. According to the present embodiment, if the guide mechanisms 103 and 105 are provided, the above-described problem may be prevented.

The guide mechanisms 103 and 105 reduce the inserting speed of the PIU 10 by using the guide cylinder 30 and the guide pin 50 used to guide the insertion of the PIU 10 into the housing 80. The increase of the number of the components may be suppressed. The pair of the guide mechanisms 103 and 105 has a function for guiding the PIU 10 to a prescribed position and direction of the housing 80 and a function for preventing the shock by reducing the inserting speed of the PIU 10.

If the PIU 10 is detached from the housing 80, the guide cylinder 30 is removed from the movable member 70, and the energizing member 109 puts back the movable member 70 in an initial position illustrated in FIG. 5A. As a result, even if the PIU 10 is again inserted into the housing 80 after being detached, the inserting speed of the PIU 10 is reduced.

The energizing member 109 energizes the movable member 70 in the opposite direction of the direction in which the guide cylinder 30 pushes the movable member 70. Thus, the inserting speed of the PIU 10 is reduced by the energizing force of the energizing member 109 as well. Since the energizing member 109 is energized in the direction in which the PIU 10 is detached, the detaching work of the PIU 10 is assisted.

Second Embodiment

Figure 6:
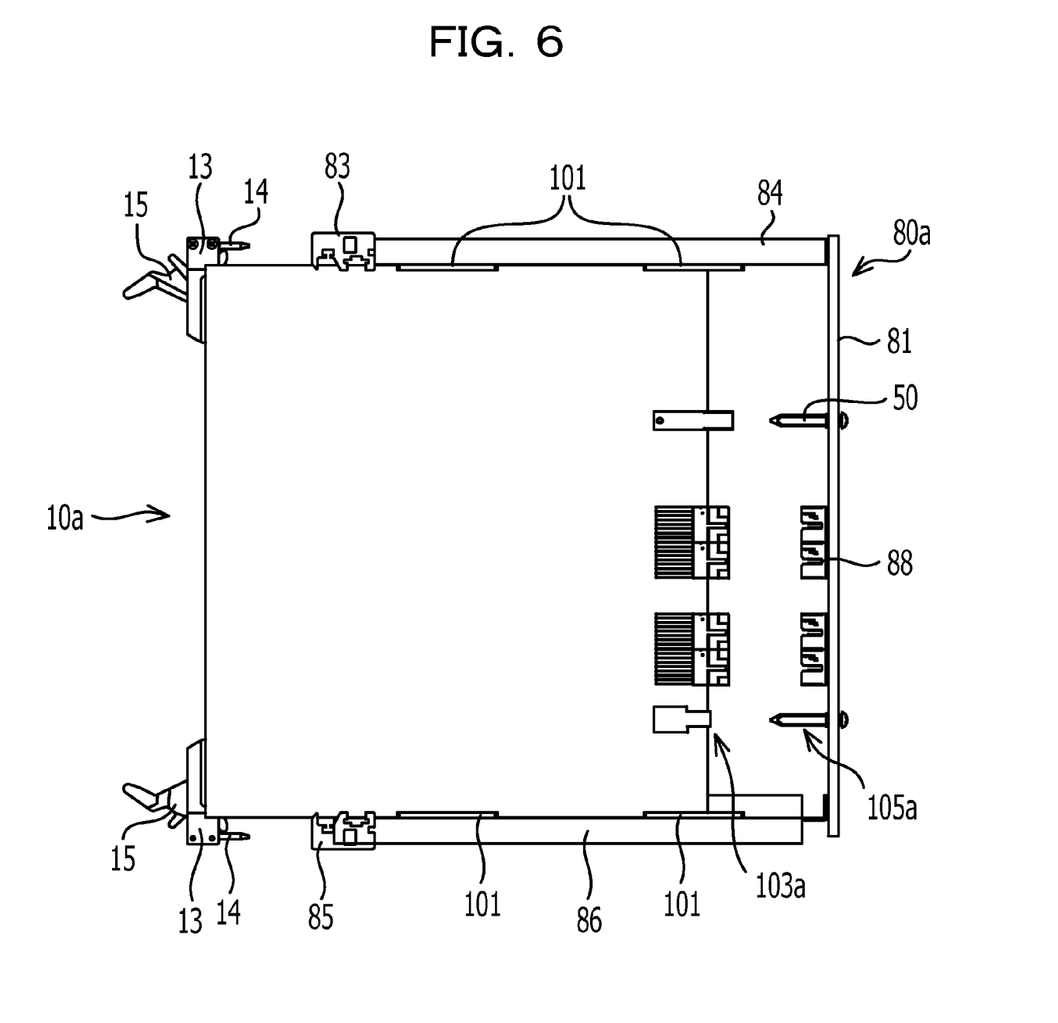
FIG. 6 is a diagram illustrating an internal structure of an electronic apparatus according to a second embodiment.

FIG. 6 illustrates an internal structure of the electronic apparatus according to the second embodiment. The similar numerals are added to the structure equivalent to the first embodiment, so that the overlapped description is omitted. A guide mechanism 103a is provided on the printed substrate 11 of a PIU 10a. A guide mechanism 105a is provided on the backplane 81 of a housing 80a.

Figure 7:
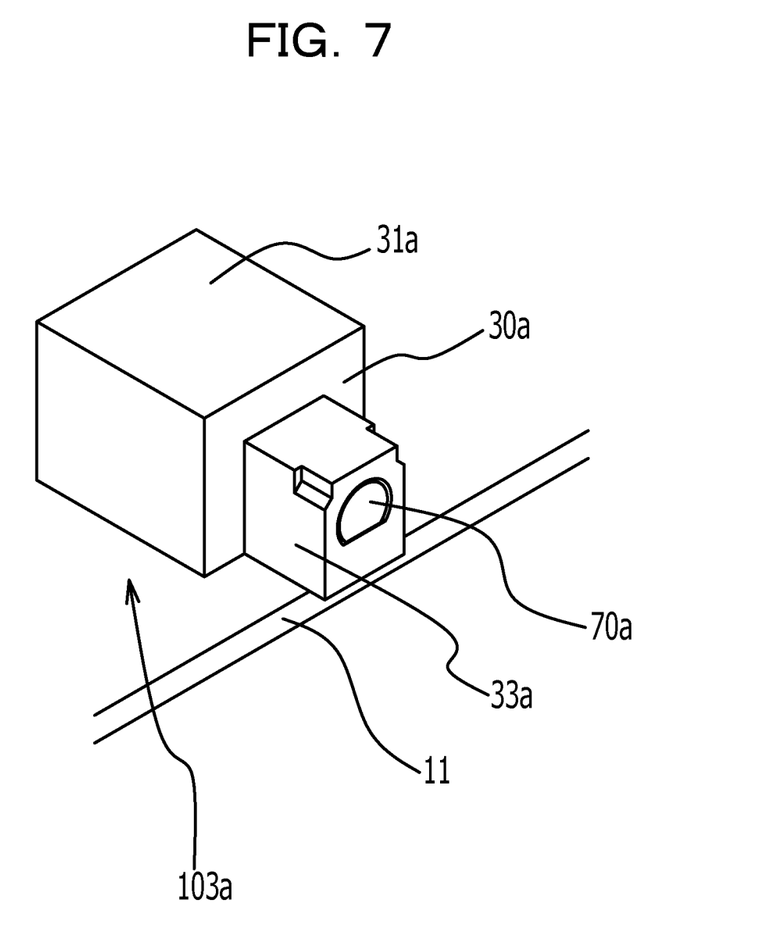
Figure 8A:
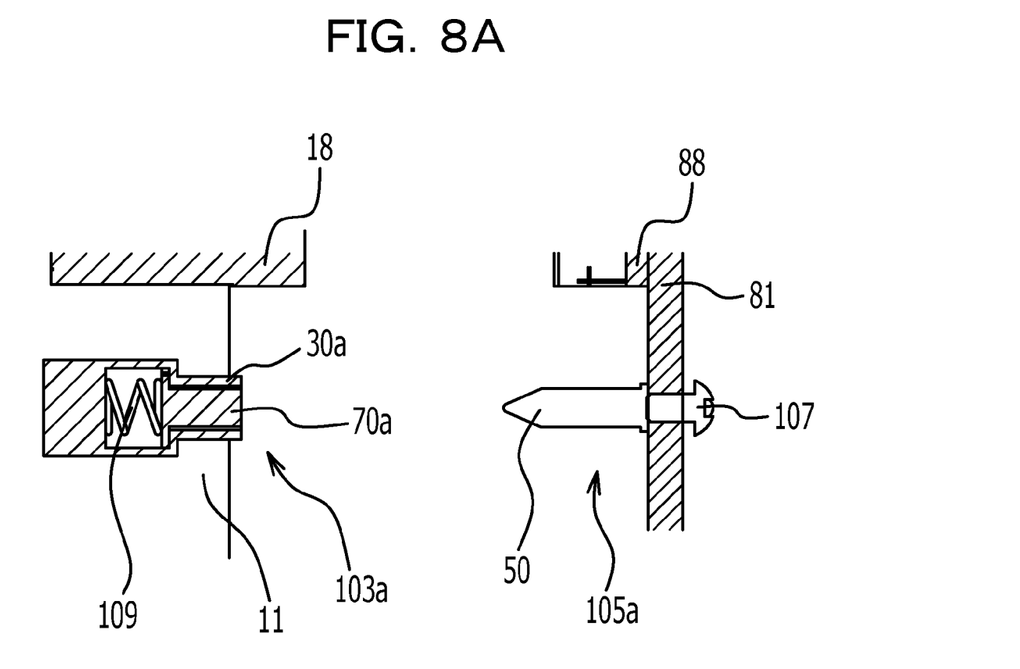
FIGS. 8A and 8B are explanatory diagrams of the guide mechanism.
Figure 8B:
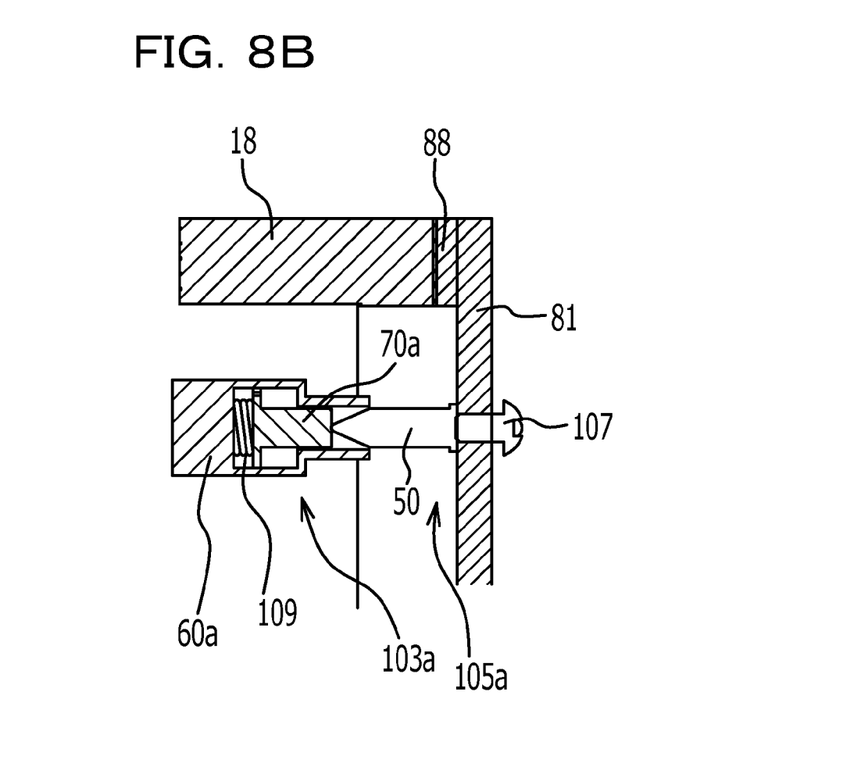
Figure 9A:
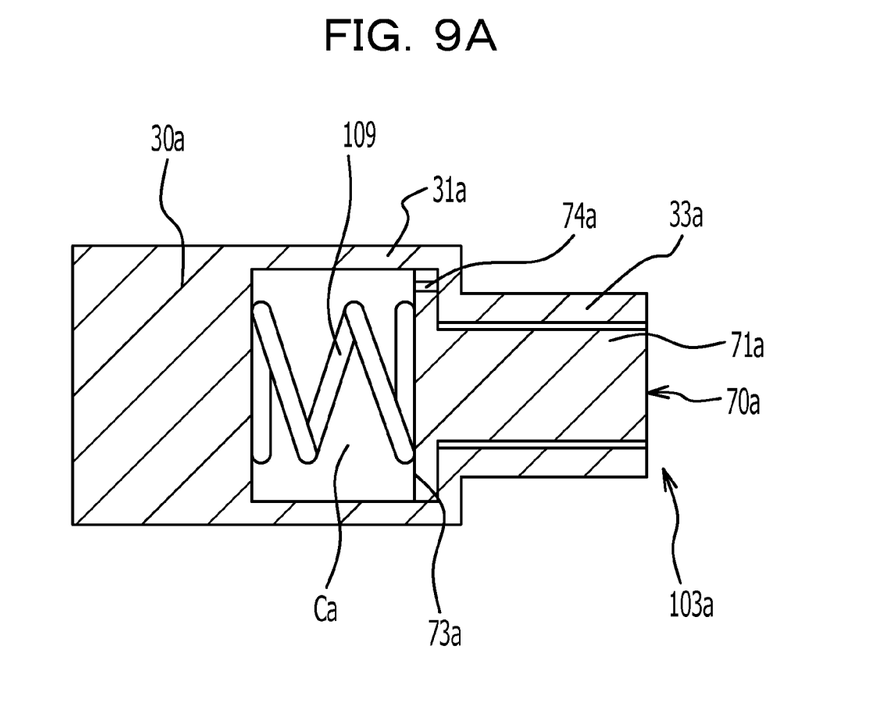
FIG. 9A is an enlarged diagram of the guide mechanism illustrated in FIG. 8A.
Figure 9B:
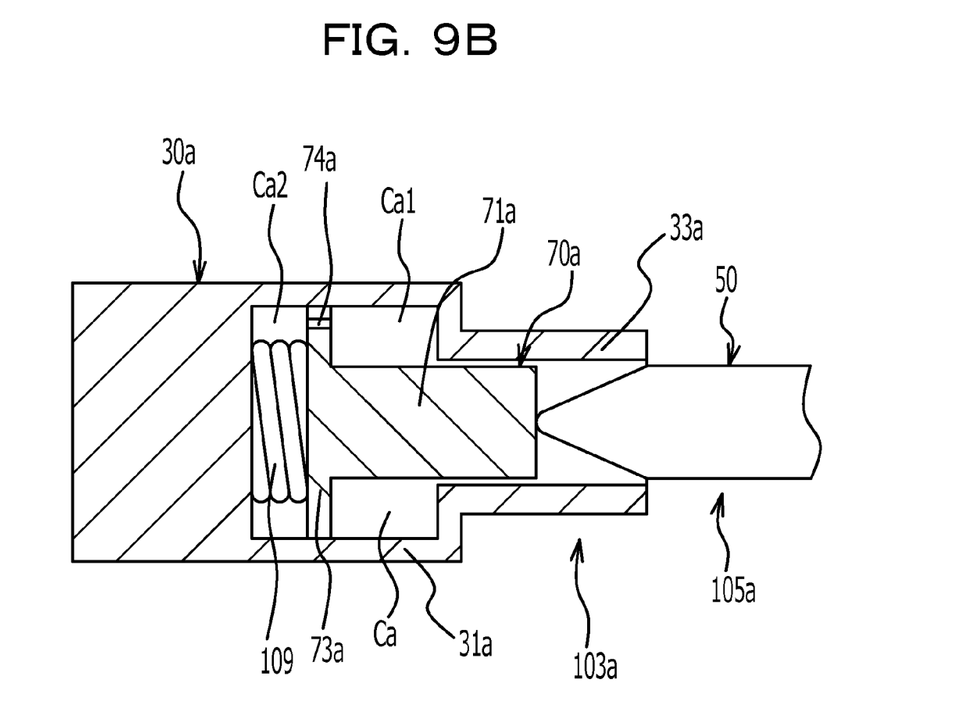
FIG. 9B is an enlarged diagram of the guide mechanism illustrated in FIG. 8B.

FIG. 7 is a perspective view of the guide mechanism 103a on the side of the PIU 10a. FIGS. 8A and 8B are explanatory diagrams of the state of the guide mechanisms 103a and 105a. FIG. 9A is an enlarged diagram of the guide mechanism 103a on the side of the PIU 10a illustrated in FIG. 8A. FIG. 9B is an enlarged diagram of the guide mechanisms 103a and 105a illustrated in FIG. 8B. The guide mechanism 103a includes a guide member 30a and a movable member 70a. The guide mechanism 105a includes a guide pin 50. The guide member 30a holds the movable member 70a that is movable in a prescribed range in the axial direction. As illustrated in FIG. 9A, the movable member 70a includes a circular column unit 71a, which is formed in an approximately circular column shape, and a flange unit 73a provided on the base end side of the circular column unit 71a. The guide member 30a includes a large cylinder unit 31a that demarcates an internal space Ca and a small cylinder unit 33a that is thinner than the large cylinder unit 31a. The flange unit 73a abuts the wall that demarcates a difference between the large cylinder unit 31a and the small cylinder unit 33a, so that the moving range in the axial direction of the movable member 70a is limited. The flange unit 73a has a hole 74a extending in the axial direction. The energizing member 109 is provided inside the internal space Ca of the guide member 30a. The energizing member 109 energizes the movable member 70a toward the backplane 81. The energizing member 109 energizes the movable member 70a in the opposite direction of the direction in which the movable member 70a is pushed by the guide pin 50.

When the PIU 10a is inserted into the end of the housing 80a, the guide pin 50 pushes the movable member 70a and the guide pin 50 is inserted into the guide member 30a as illustrated in FIG. 9B. At this time, as in FIG. 4B, the connector 18 is engaged with the connector 88. In this manner, before the connector 18 is engaged with the connector 88, and the guide pin 50 pushes the movable member 70a. Therefore, when the inserting speed of the PIU 10a is reduced, the connector 18 is engaged with the connector 88.

The reason why the inserting speed of the PIU 10a is reduced is that the movable member 70a is not easily moved in the opposite direction of the direction in which the guide pin 50 pushes the movable member 70a based on the pressure between a space Ca1 and a space Ca2. Due to this, the PIU 10a is prevented from being inserting fast into the housing 80a.

The guide mechanisms 103a and 105a reduce the inserting speed of the PIU 10a by using the guide member 30a and the guide pin 50 that are used to guide the insertion of the PIU 10a into the housing 80. The increase of the number of the components is suppressed. That is, the pair of the guide mechanisms 103a and 105a has a function for guiding the PIU 10a to a prescribed position and direction of the housing 80a and a function for preventing the shock by reducing the inserting speed of the PIU 10a.

If the PIU 10a is detached from the housing 80a, the energizing member 109 puts back the movable member 70a in an initial position illustrated in FIG. 9A. The energizing member 109 energizes the movable member 70a in the opposite direction of the direction in which the guide pin 50 pushes the movable member 70a. Thus, the inserting speed of the PIU 10a is reduced by the energizing force of the energizing member 109 as well. Since the energizing member 109 is energized in the direction in which the PIU 10a is detached, the energizing member 109 assists the detaching work of the PIU 10a.

Third Embodiment

Figure 10:
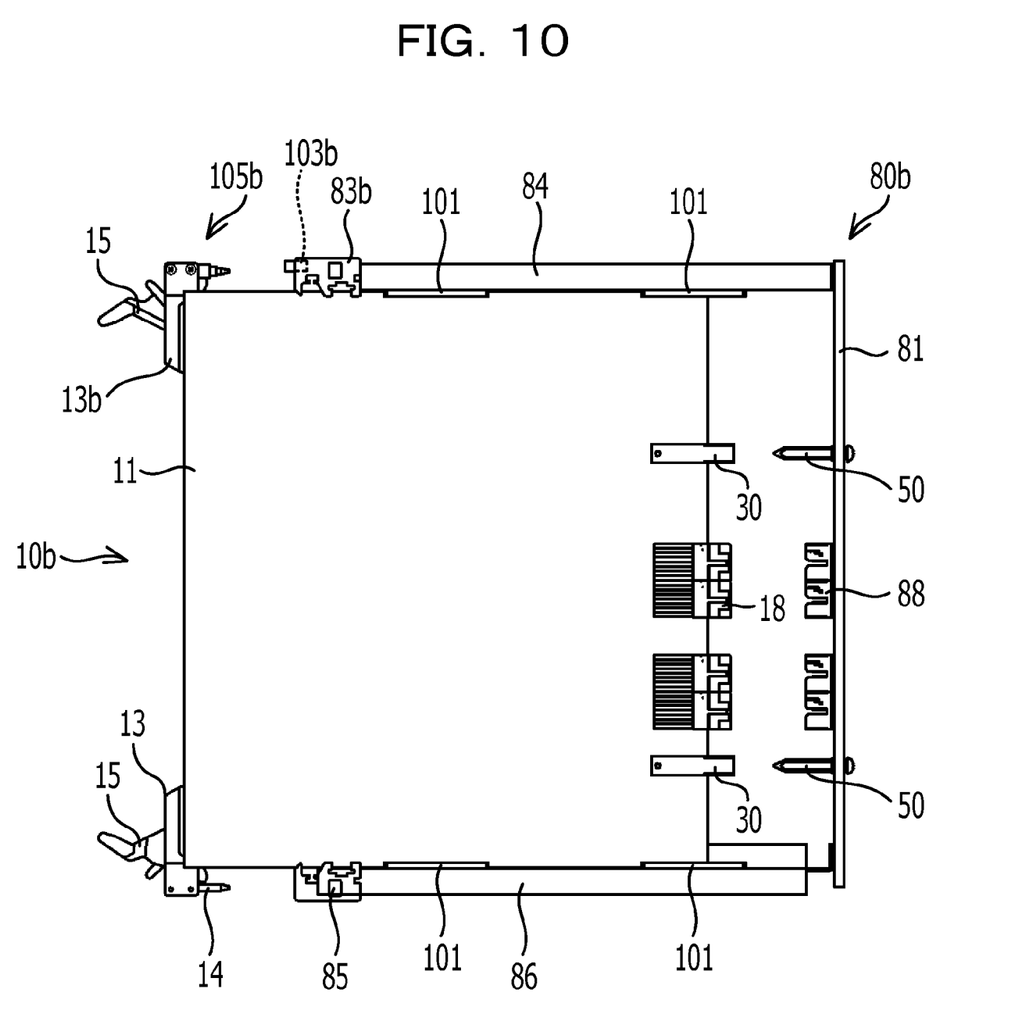
FIG. 10 is a diagram illustrating an internal structure of an electronic apparatus according to a third embodiment.
Figure 11:
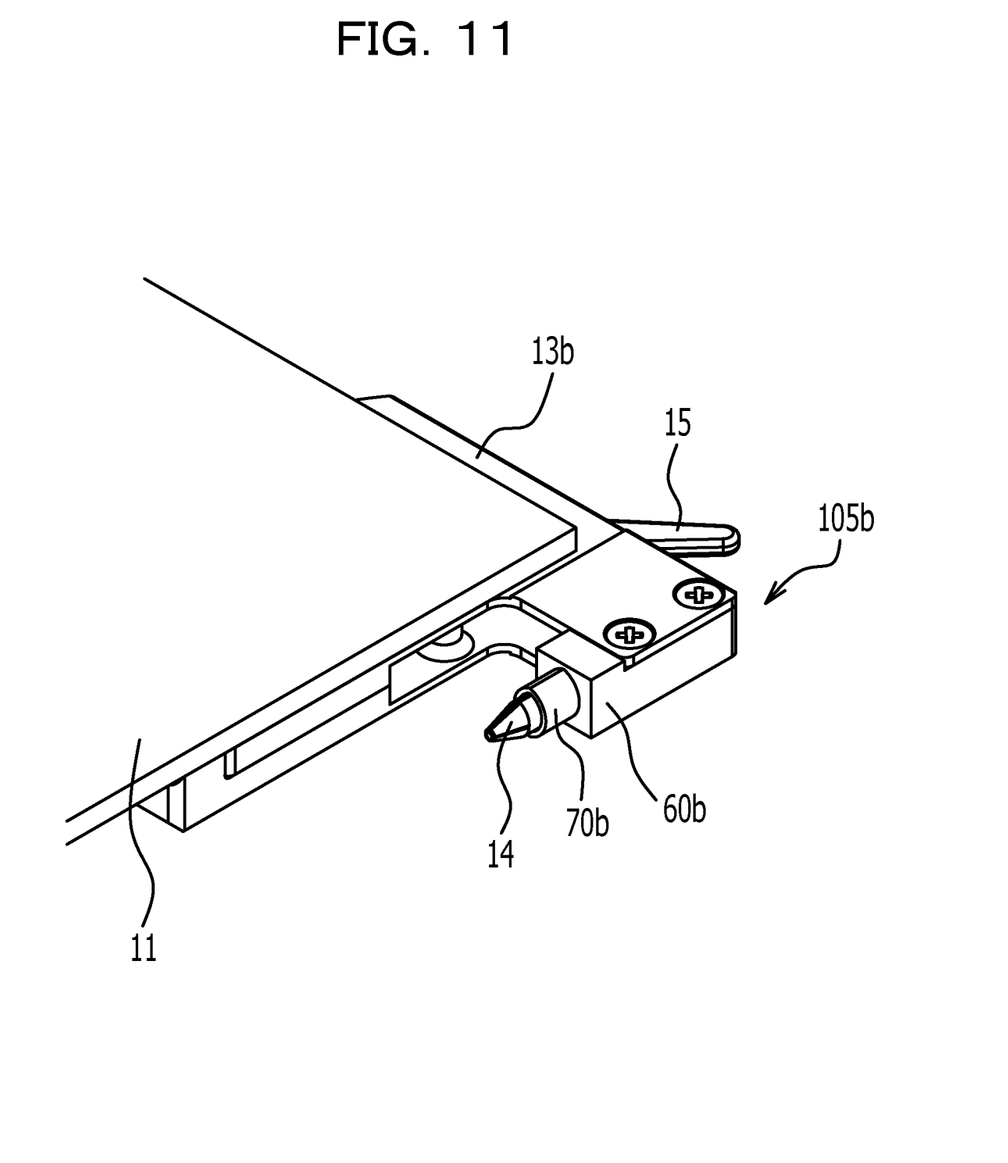
FIG. 11 is an enlarged diagram of the guide mechanism.
Figure 12:
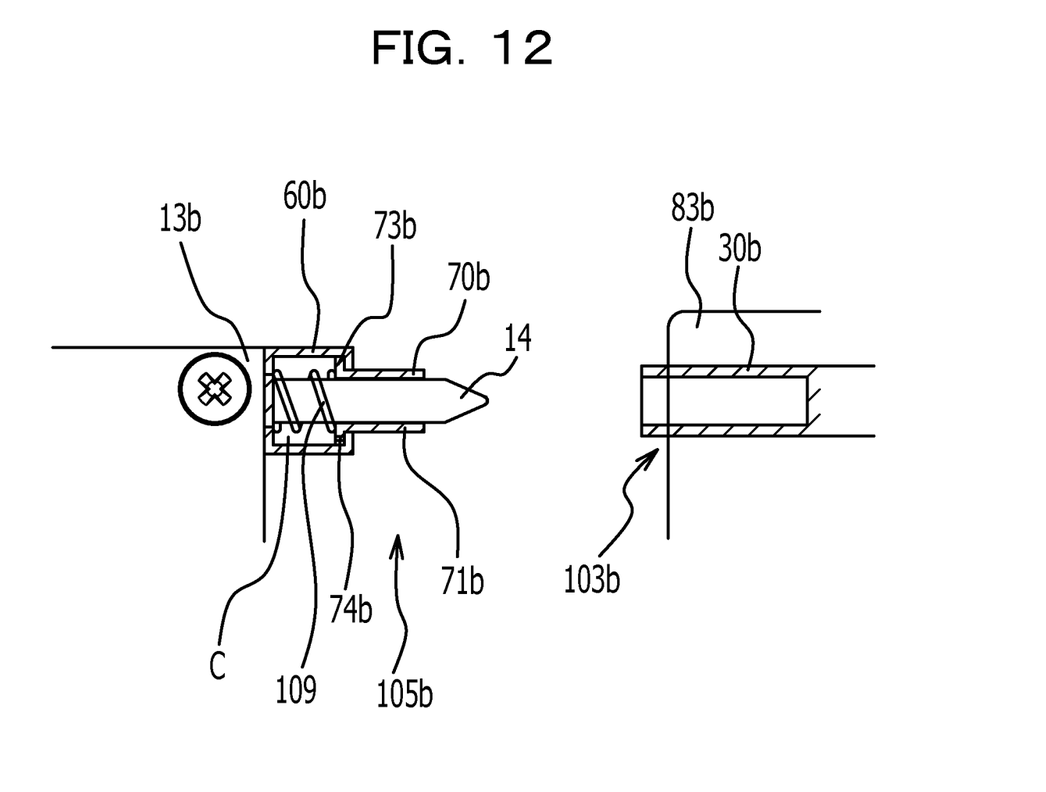
FIG. 12 is an explanatory diagram of the guide mechanism.

FIG. 10 illustrates an internal structure of the electronic apparatus according to the third embodiment. An attachment member 13b of the PIU 10b is provided with a guide mechanism 105b. A frame 83b of a housing 80b is provided with a guide mechanism 103b. FIG. 11 is an enlarged diagram of the guide mechanism 105b on the side of the PIU 10b. FIG. 12 is an explanatory diagram of the guide mechanisms 103b and 105b.

The guide mechanism 105b on the side of the PIU 10b includes the guide pin 14, a fixed member 60b, a movable member 70b, and the energizing member 109. The guide mechanism 103b includes a guide cylinder 30b. If the guide pin 14 is inserted into the guide cylinder 30b, the guide cylinder 30b abuts the movable member 70b, and the movable member 70b is pushed by the guide cylinder 30b against the energizing force of the energizing member 109. The guide mechanisms 103b and 105b prevent the PIU 10 from being inserted fast into the housing 80b. The increase of the member of the components is suppressed.

Figure 13:
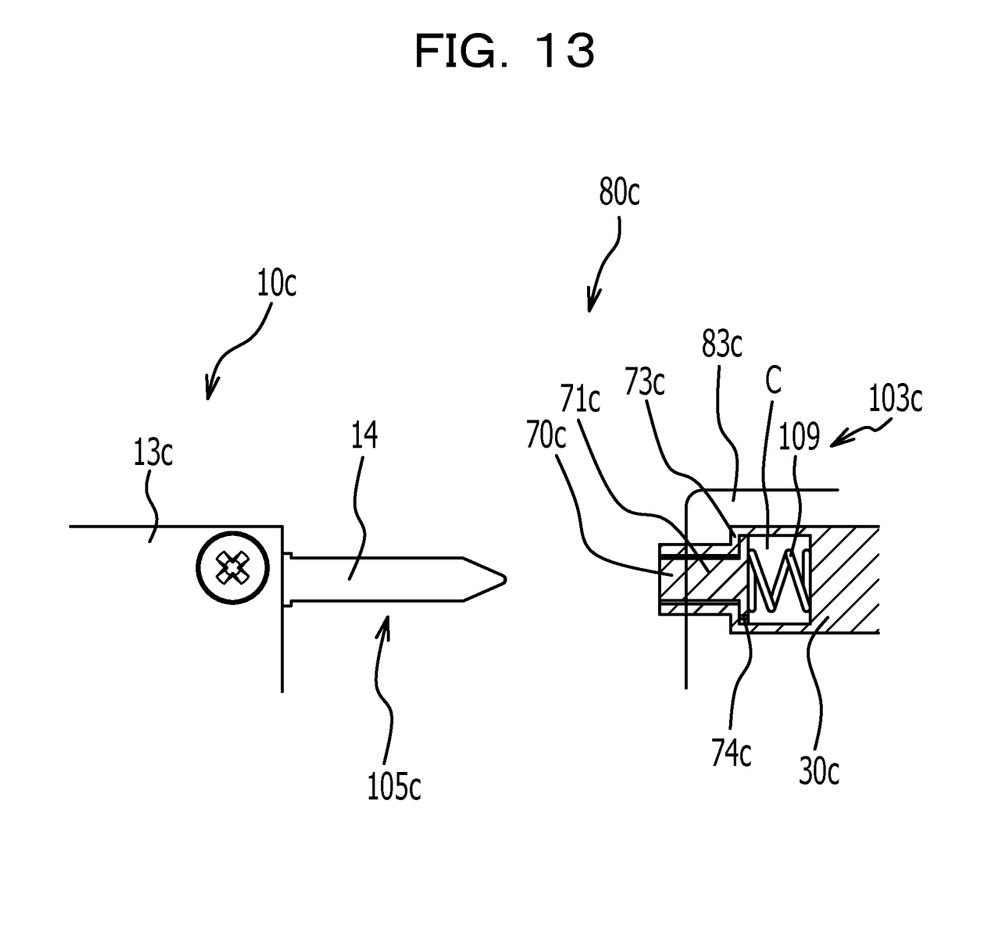
FIG. 13 is an explanatory diagram of a deformation example of the electronic apparatus according to the third embodiment.

FIG. 13 is an explanatory diagram of a deformation (alternative) example of the electronic apparatus according to the third embodiment. A guide mechanism 105c is provided on the side of a PIU 10c. A guide mechanism 103c is provided on the side of a housing 80c. The guide mechanism 105c includes the guide pin 14. The guide mechanism 103c includes a fixed member 30c, a movable member 70c, and the energizing member 109. The movable member 70c is held by the fixed member 30c to be movable in a prescribed range in the axial direction. The movable member 70c is energized on the side of the PIU 10c by the energizing member 109. When the guide pin 14 pushes the movable member 70c, the inserting speed of the PIU 10c is reduced. The increase of the number of the components is suppressed.

Fourth Embodiment

Figure 14A:
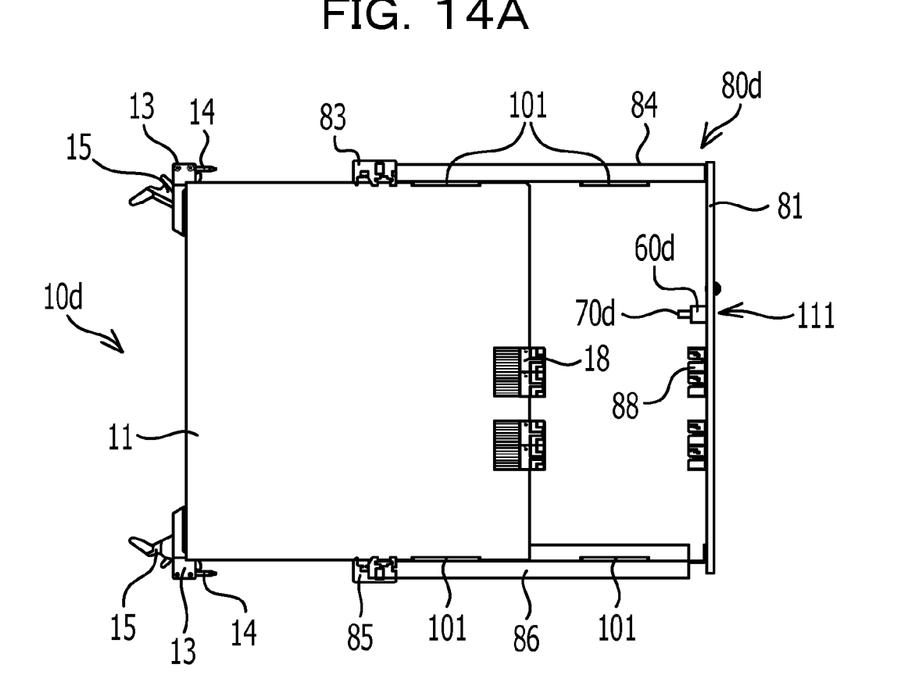
FIGS. 14A and 14B are explanatory diagrams of an internal structure of an electronic apparatus according to a fourth embodiment.
Figure 14B:
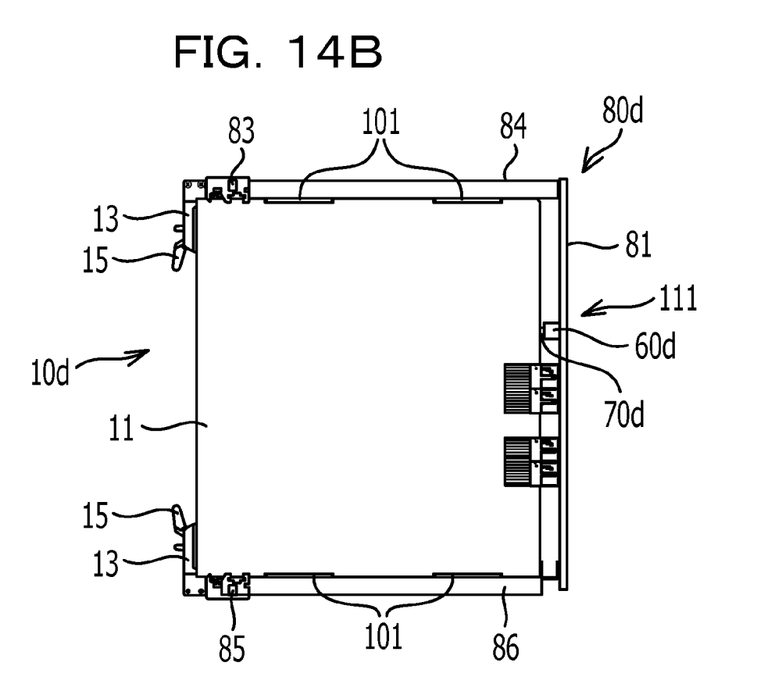

FIGS. 14A and 14B are explanatory diagrams of the internal structure of the electronic apparatus according to the fourth embodiment. A buffer mechanism 111 is provided on the backplane 81 of a housing 80d. The buffer mechanism 111 does not have a function for guiding the insertion of a PIU 10d into the housing 80d. A movable member 70d is provided in a fixed cylinder 60d to be movable in a prescribed range in the axial direction. The tip of the movable member 70d is projected from the fixed cylinder 60d. The internal structures of the movable member 70d and the fixed cylinder 60d are equivalent to the guide mechanism 103a that is employed by the electronic apparatus according to the second embodiment. As illustrated in FIG. 14B, when the PIU 10d is inserted into the end of the housing 80d, the base end of the PIU 10d pushes the movable member 70d. As a result, the inserting speed of the PIU 10d is reduced.

Figure 15A:
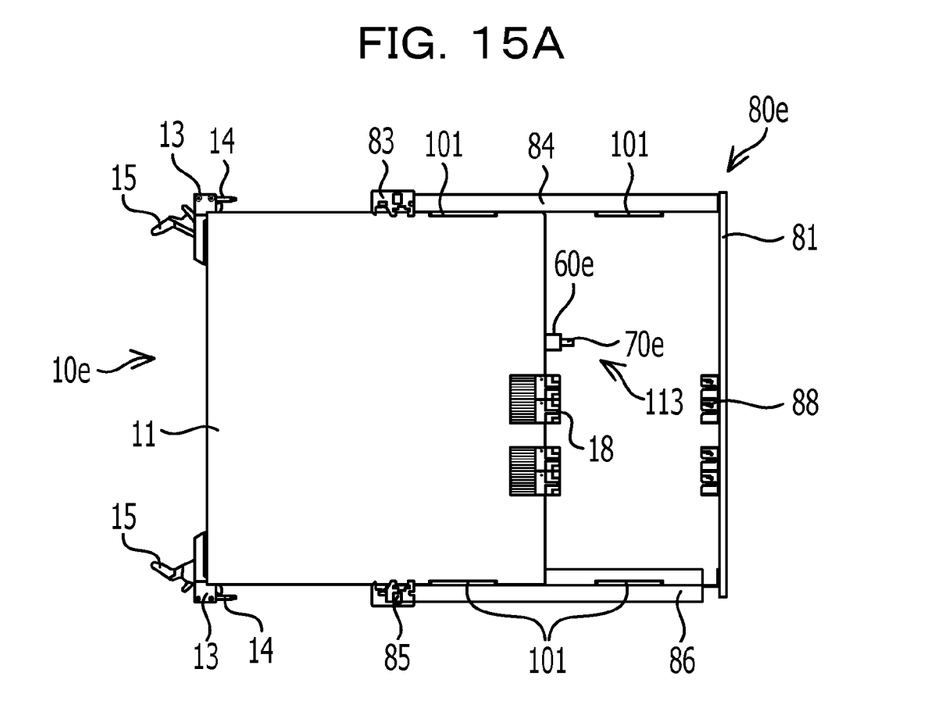
FIGS. 15A and 15B are explanatory diagrams of the internal structure of a deformation diagram of the electronic apparatus according to the fourth embodiment.
Figure 15B:
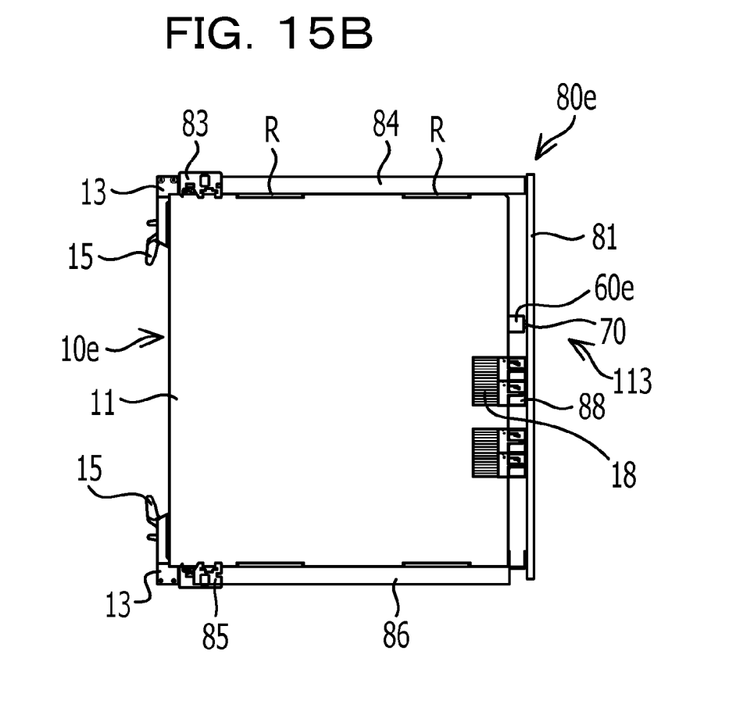

FIGS. 15A and 15B are explanatory diagrams of the internal structure of the deformation (alternative) example of the electronic apparatus according to the fourth embodiment. A buffer mechanism 113 is provided in the base end of the printed substrate 11 of a PIU 10e. The buffer mechanism 113 does not include a function for guiding the insertion of the PIU 10e into a housing 80e. A movable member 70e is provided on a fixed cylinder 60e to be movable in a prescribed range in the axial direction. The tip of the movable member 70e is projected from the fixed cylinder 60e. The fixed cylinder 60e and the movable member 70e have the configuration equivalent to the fixed cylinder 60d and the movable member 70d. As illustrated in FIG. 15B, if the PIU 10e is inserted into the end of the housing 80e, the backplane 81 pushes the movable member 70e. Due to this, the inserting speed of the PIU 10e is reduced.

Although the embodiments of the present invention have been described in detail, it should be understood that the various changes, substitutions, and alterations could be made hereto without departing from the spirit and scope of the invention.

According to an aspect of the embodiments of the invention, any combinations of one or more of the described features, functions, operations, and/or benefits can be provided. A combination can be one or a plurality. One or more guide mechanism pairs 103 and 105 may be provided at any of one or more positions along an insertion direction of a PIU 10 into a housing 80.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. An electronic apparatus, comprising:
a housing which has a first connector;
a Plug In Unit which has a second connecter, which is coupled to the first connector when inserted into the housing;
a first guide mechanism which is provided on either the housing or the Plug In Unit;
a second guide mechanism paired with the first guide mechanism and which is provided on either the housing or the Plug In Unit for cooperation with the first guide mechanism and guiding insertion of the Plug In Unit into the housing so that the first connector is coupled to the second connector;
wherein one of the first or second guide mechanism comprises a guide cylinder,
wherein other one of the first or second guide mechanism comprises:
a guide pin which may be inserted into the guide cylinder;
a fixed cylinder which surrounds the guide pin; and
a movable member held between the guide pin and the fixed cylinder to be movable in a prescribed range in an axial direction and which has a hole that passes through the fixed cylinder in the axial direction, and
wherein the movable member is push-able by the guide cylinder when the guide pin is inserted into the guide cylinder with air flowing through the hole of the movable member.

2. The electronic apparatus according to claim 1, wherein the movable member is energized in a direction opposite to a direction in which the movable member is pushed.

* * * * *